(12) United States Patent
Duan et al.

(10) Patent No.: US 11,265,657 B2
(45) Date of Patent: Mar. 1, 2022

(54) PIEZOELECTRIC MEMS MICROPHONE

(71) Applicant: AAC ACOUSTIC TECHNOLOGIES (SHENZHEN) CO., LTD., Shenzhen (CN)

(72) Inventors: Lian Duan, Shenzhen (CN); Rui Zhang, Shenzhen (CN); Zhiyuan Chen, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 7 days.

(21) Appl. No.: 16/987,421

(22) Filed: Aug. 7, 2020

(65) Prior Publication Data

US 2021/0051414 A1 Feb. 18, 2021

(30) Foreign Application Priority Data

Aug. 16, 2019 (CN) .......................... 201910760704.1

(51) Int. Cl.
*H04R 17/02* (2006.01)
*H04R 7/06* (2006.01)
*B81B 3/00* (2006.01)
*H04R 7/18* (2006.01)

(52) U.S. Cl.
CPC ............ *H04R 17/02* (2013.01); *B81B 3/0037* (2013.01); *H04R 7/06* (2013.01); *H04R 7/18* (2013.01); *B81B 2201/0257* (2013.01); *B81B 2203/0118* (2013.01); *B81B 2203/0127* (2013.01); *H04R 2201/003* (2013.01)

(58) Field of Classification Search
CPC ................ B81B 3/0021; B81B 3/0037; B81B 2201/0257; B81B 2203/0118; B81B 2203/0127; B81B 2203/04; H04R 7/06; H04R 17/02; H04R 17/025; H04R 31/003; H04R 7/18; H04R 19/005; H04R 2201/003; H04R 2207/023; H04R 2207/025
See application file for complete search history.

(56) References Cited

U.S. PATENT DOCUMENTS 9,029,963 B2* 5/2015 Sparks .................. B81B 3/0018
257/416
9,055,372 B2* 6/2015 Grosh ...................... H01L 41/27
10,710,874 B2* 7/2020 Frischmuth ............ H04R 19/02

* cited by examiner

*Primary Examiner* — Brian Ensey
(74) *Attorney, Agent, or Firm* — W&G Law Group

(57) ABSTRACT

The invention provides a piezoelectric micro-electromechanical system (MEMS) microphone includes a base with a cavity and a piezoelectric diaphragm arranged on the base. The base has a ring base and a support column. The piezoelectric diaphragm includes a plurality of diaphragm sheets. Each diaphragm sheet has a fixing end connected with the support column and a free end suspended above the cavity. The widths of the diaphragm sheets are gradually increased from the fixing ends to the free ends. According to the piezoelectric MEMS microphone provided by the invention, under sound pressure, the free ends vibrate, wide free ends drive short fixing ends, and the diaphragm sheets close the fixing ends generate greater deformation to generate more charge. Therefore, the sensitivity can be further improved.

9 Claims, 6 Drawing Sheets

PIEZOELECTRIC MEMS MICROPHONE

FIELD OF THE PRESENT DISCLOSURE

The invention relates to the technical field of acousto-electric conversion devices, in particular to a piezoelectric micro-electro-mechanical systems (MEMS) microphone.

DESCRIPTION OF RELATED ART

A micro-electro-mechanical systems (MEMS) microphone is an electroacoustic transducer manufactured by a micromachining technology and has the characteristics of small volume, good frequency response characteristic, low noise and the like. Along with the miniaturization and thinness of electronic devices, the MEMS microphone is widely applied to these devices.

The current MEMS microphone mainly comprises a condenser MEMS microphone and piezoelectric MEMS microphones. Compared with a traditional condenser MEMS microphone, the piezoelectric MEMS microphones have multiple advantages, including waterproof, dustproof, relatively high maximum output sound pressure (AOP) and the like. Different from the structure of a piezoelectric diaphragm of the condenser microphone, the piezoelectric diaphragm of one MEMS microphone is composed of a plurality of diaphragm sheets, one end of each diaphragm sheet is connected with a base and the other end adopts a cantilever beam structure to avoid deformation of the surfaces of the diaphragm sheets caused by residual stress in a process, so as to reduce noise floors and improve the sensitivity.

FIGS. 1-4 are designs of two typical piezoelectric MEMS microphones. This structure is characterized in that fixing ends 211 of the diaphragm sheets 21 on the piezoelectric diaphragm 20 are arranged at periphery of a cavity 14 on the base 10 and the free ends 212 are arranged at the center. The diaphragm sheets 21 are of a triangular or fan-shaped structure that the widths of cantilever beams from the fixing ends 211 to the free ends 212 are gradually reduced. Under sound pressure, the free ends 212 drive the cantilever beams to vibrate; the diaphragm sheets 21 close to the fixing ends 211 generate voltage under the action of force.

When an external sound signal is transferred from a sound hole, deformation of the cantilever beams is caused by the sound pressure to generate a voltage change, so as to sense an acoustic signal. In a practical application, for given materials of the diaphragm sheets 21 and a given dimension of an MEMS Die, the designs as shown in FIGS. 1-4 have limitations in sensitivity thereof, and the sensitivity of the MEMS Die is generally about −43 dB regardless of the gain of an application specific integrated circuit (ASIC) and cannot be easily improved to above −40 dB.

Therefore, in order to improve the sensitivity of the piezoelectric MEMS microphones, it is necessary to improve a novel piezoelectric MEMS microphone to improve the overall structure and to improve the sensitivity, so as to solve the problems mentioned above.

SUMMARY OF THE INVENTION

One of the major objects of the present invention is to provide a piezoelectric MEMS microphone with improved sensitivity.

Accordingly, the present invention provides a piezoelectric micro-electromechanical system (MEMS) microphone, comprising: a base with a cavity, comprising a ring base and a support column arranged at an inner side of the ring base and arranged apart from the ring base; a piezoelectric diaphragm arranged on the base, comprising a plurality of diaphragm sheets arranged spaced from each other along a circumferential direction of the support column. Each diaphragm sheet includes a fixing end connected with the support column and a free end suspended above the cavity; and the widths of the diaphragm sheets are gradually increased from the fixing ends to the free ends.

As an improvement, the base further comprises a plurality of support beams arranged apart from each other; one ends of the support beams are connected with the support column and the other ends are connected with the ring base to divide the cavity into a plurality of sub-cavities along the circumferential direction of the support column; and the free ends are suspended above the sub-cavities.

As an improvement, one free end is suspended above each sub-cavity.

As an improvement, projection profiles of the free ends in a vibration direction are positioned within the projection profiles of the sub-cavities in the vibration direction.

As an improvement, the projection profile of each free end in the vibration direction is the same as the projection profile of the corresponding sub-cavity in the vibration direction in shape.

As an improvement, the piezoelectric MEMS microphone includes a first wall body arranged at one side of the ring base toward the support column, and a second wall body arranged at one side of the support column toward the ring base; wherein the projection profiles of the first wall body and the second wall body in the vibration direction both are circular.

As an improvement, the projection profiles of the diaphragm sheets in the vibration direction are fan-shaped.

As an improvement, the projection profiles of the first wall body and the second wall body in the vibration direction both are polygonal.

As an improvement, the projection profiles of the diaphragm sheets in the vibration direction are trapezoidal.

As an improvement, one of the projection profile of the first wall body in the vibration direction and the projection profile of the second wall body in the vibration direction is circular and the other one is polygonal.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

Figure 1:
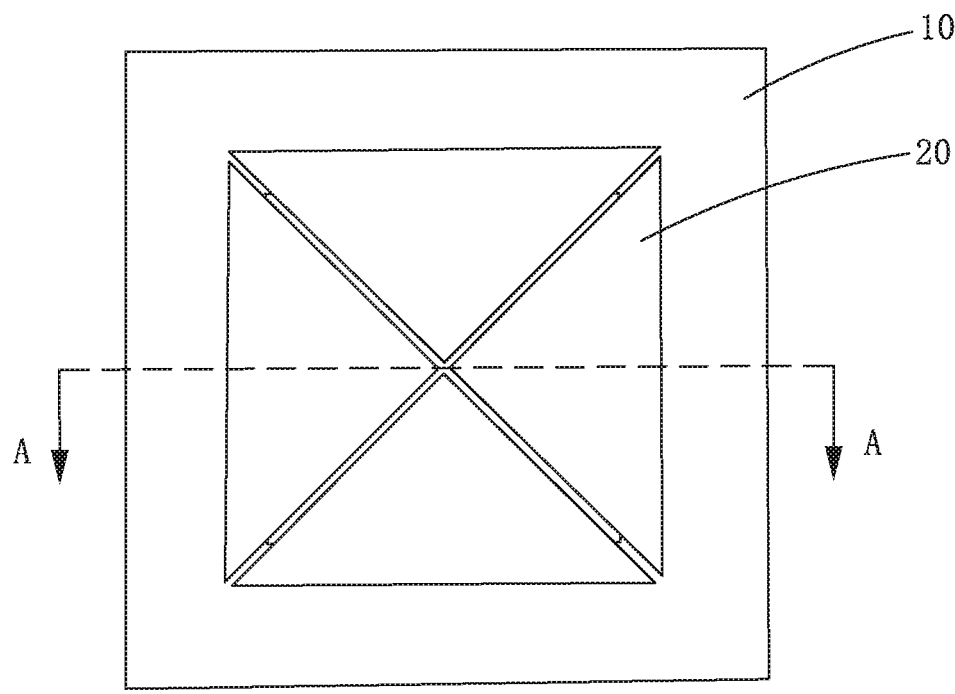
FIG. 1 is a top view of a piezoelectric micro-electromechanical system (MEMS) microphone I in a related art.
Figure 2:
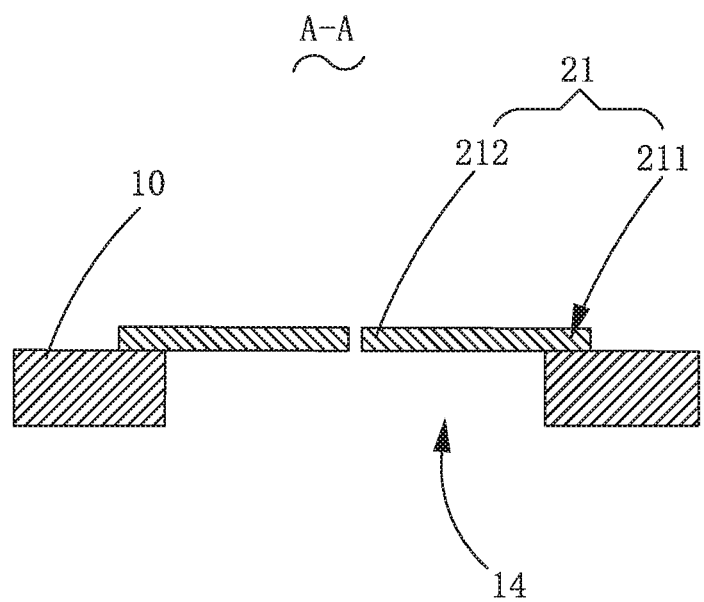
FIG. 2 is a cross-sectional view of the microphone taken along line A-A in FIG. 1.
Figure 3:
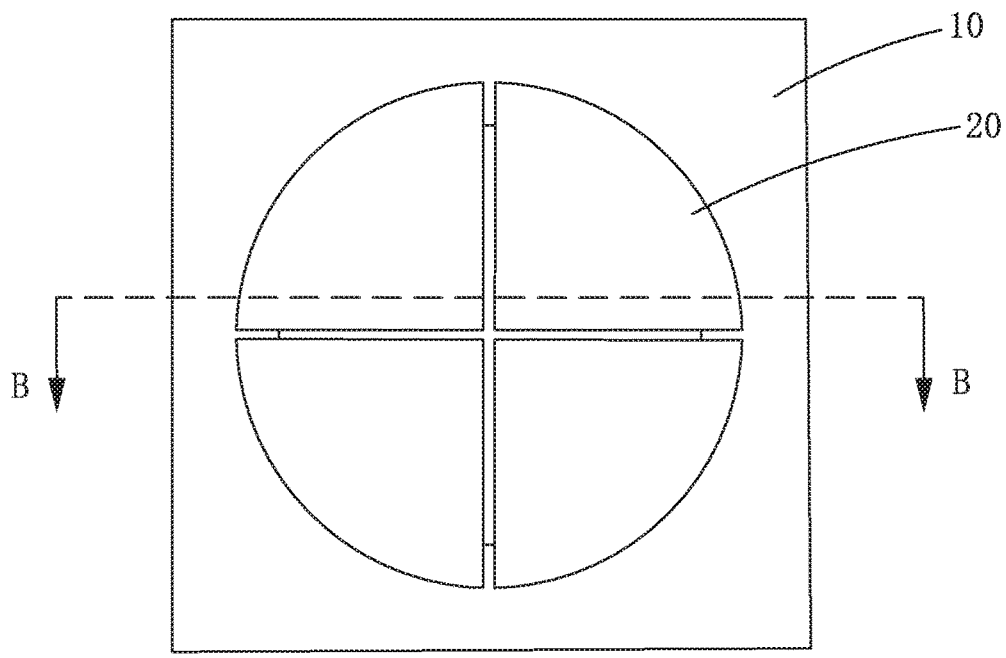
FIG. 3 is a top view of a piezoelectric MEMS microphone II in another related art.
Figure 4:
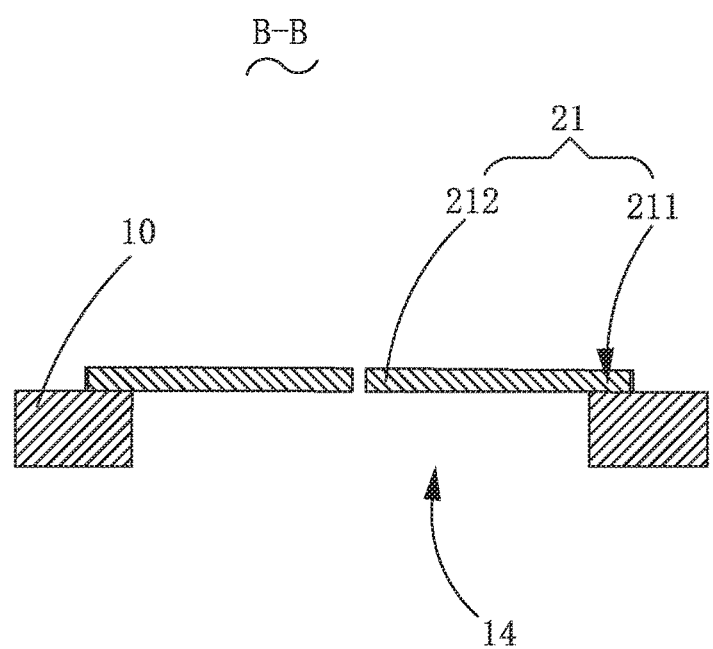
FIG. 4 is a cross-sectional view of the microphone taken along line B-B in FIG. 3.
Figure 5:
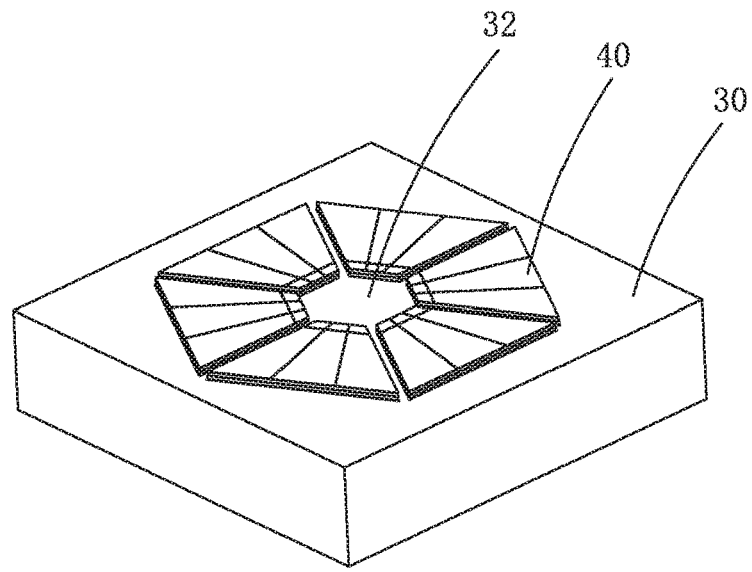
FIG. 5 is an isometric view of a piezoelectric MEMS microphone provided by an embodiment of the invention.
Figure 6:
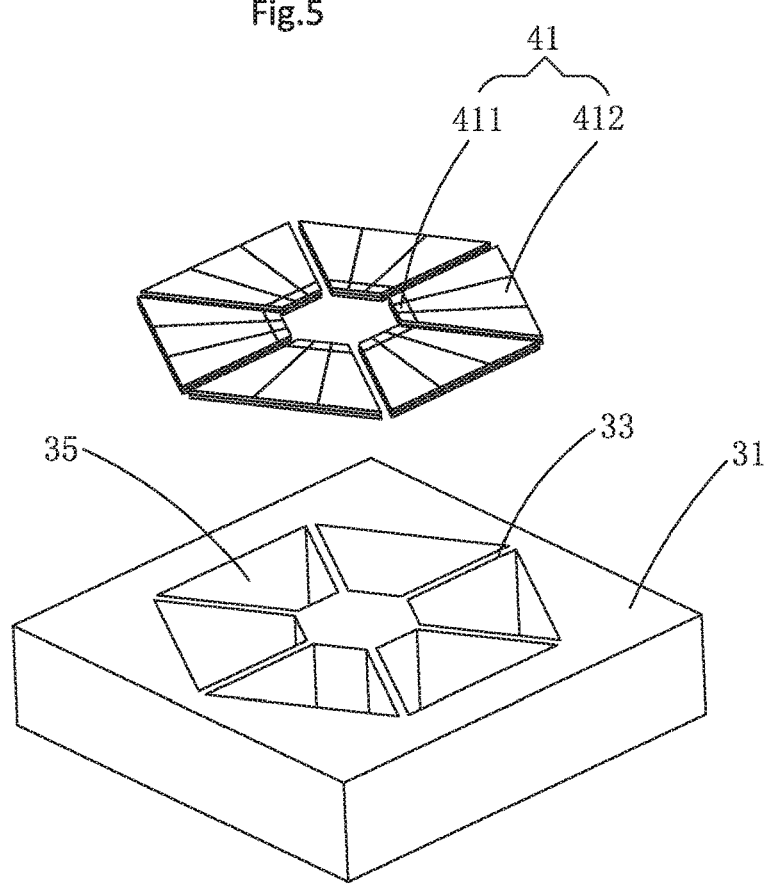
FIG. 6 is an exploded view of the piezoelectric MEMS microphone provided by the embodiment of the invention.
Figure 7:
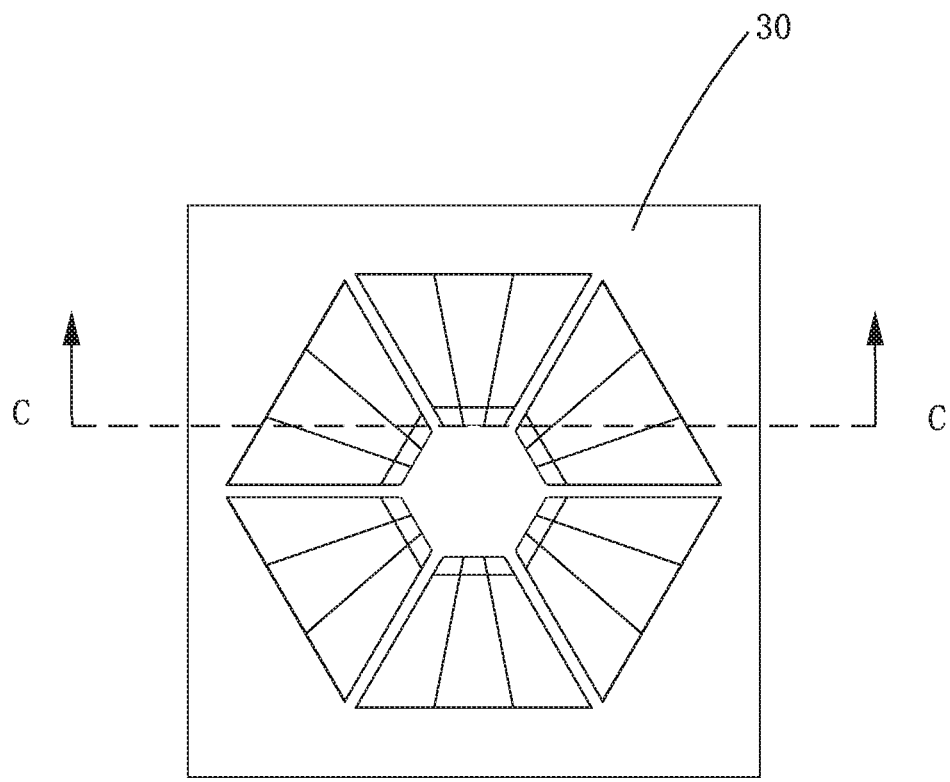
FIG. 7 is a top view of the piezoelectric MEMS microphone provided by the embodiment of the invention.
Figure 8:
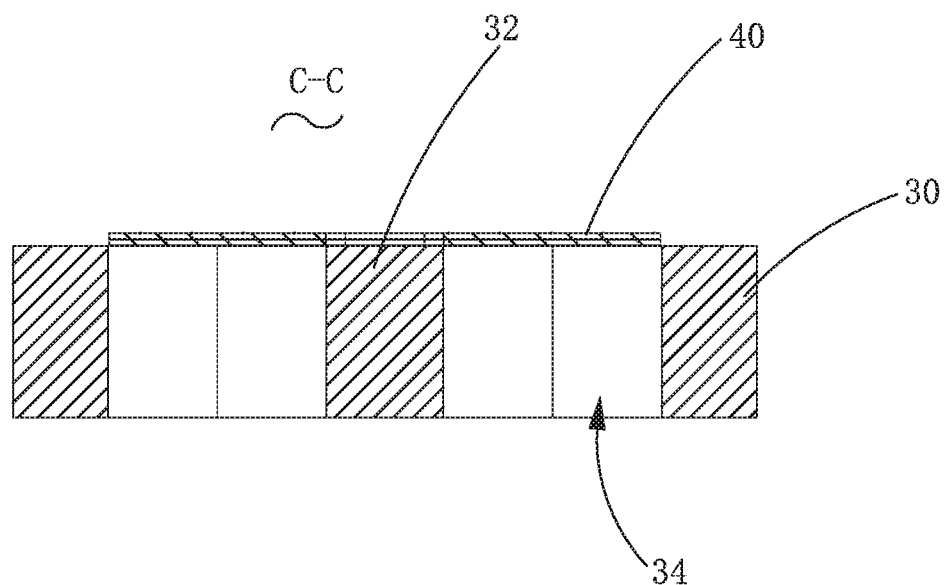
FIG. 8 is a cross-sectional view of the piezoelectric MEMS microphone taken along line C-C in FIG. 7.

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

What needs to be explained is that all directional indications (Such as upper, lower, inner, outer, top, bottom . . . ) in the embodiment of the invention are only used to explain the relative positional relationship between various components under a certain posture (as shown in the drawings), etc. If the specific posture changes, the directional indication will also change accordingly.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Referring to FIGS. 5-12, the embodiment of the invention provides a piezoelectric micro-electromechanical system (MEMS) microphone. The piezoelectric MEMS microphone comprises a base 30 and a piezoelectric diaphragm 40 arranged on the base 30. An external sound signal is transferred from a sound hole, sound pressure generated by sound will cause deformation of the piezoelectric diaphragm 40 to generate a voltage change, so as to sense an acoustic signal.

Referring to FIGS. 5-8, the base 30 comprises a ring base 31, a support column 32 arranged at an inner side of the ring base 31 and arranged apart from the ring base 31, and a plurality of support beams 33 arranged at intervals along the circumferential direction of the support column 32. The base 30 is provided with a cavity 34, the support column 32 is connected with the ring base 31 through the support beams 33, and the ring base 31 and the support column 32 define the annular cavity 34. One ends of the support beams 33 are connected with the support column 32 and the other ends are connected with the ring base 31 to divide the cavity 34 into a plurality of sub-cavities 35 arranged at intervals along the circumferential direction of the support column 32. The ring base 31 may be a 360-degree closed ring or may not be a complete ring.

The piezoelectric diaphragm 40 comprises a plurality of diaphragm sheets 41 arranged at intervals along the circumferential direction of the support column 32. Each diaphragm sheet 41 comprises a fixing end 411 connected with the support column 32 and a free end 412 connected with the fixing end 411 and suspended above each sub-cavity 35. The diaphragm sheets 41 are arranged as cantilever beams. The diaphragm sheets 41 extend from the fixing ends 411 to the free ends 412 in a form that the width dimensions are gradually increased, thus, under the sound pressure, the free ends 412 drive the diaphragm sheets 41 with a cantilever beam structure to vibrate, and the diaphragm sheets 41 close to the fixing ends 411 generate greater deformation under the action of force to generate more charge. Therefore, the sensitivity of the diaphragm sheets can be further improved. In a specific experiment, for the case that the same area of MEMS chip and diaphragm structure do not change, by adopting this structural design, a sensitivity value can be increased to above −37 dB and is significantly increased in comparison with the sensitivity of −43 dB of a traditional structure.

In the embodiment, one free end 412 is suspended above each sub-cavity 35. A first wall body 311 is arranged at one side (an inner side wall of the ring base 31), toward the support column 32, of the ring base 31; a projection profile of the first wall body 311 in a vibration direction may be circular or polygonal; and the number of the support beams 33 can be set according to actual requirements, and is not specifically limited. When the projection profile of the first wall body 311 in the vibration direction is polygonal, the number of the support beams 33 can be smaller than, equal to or greater than the number of vertices of a polygon. It should be noted that, two or more free ends 412 can also be suspended above each sub-cavity 35, and are specifically arranged according to actual design requirements.

As a preferred embodiment, the projection profiles of the free ends 412 in the vibration direction are positioned within the projection profiles of the sub-cavities 35 in the vibration direction, and one free end 412 is correspondingly arranged in each sub-cavity 35. Preferably, the projection profile of each free end 412 in the vibration direction is the same as the projection profile of the corresponding sub-cavity 35 in the vibration direction in shape, so that the piezoelectric diaphragm 40 can cover the cavity 34 to avoid an influence on a sound generation effect caused by a too large gap between the piezoelectric diaphragm 40 and the base 30.

Figure 9:
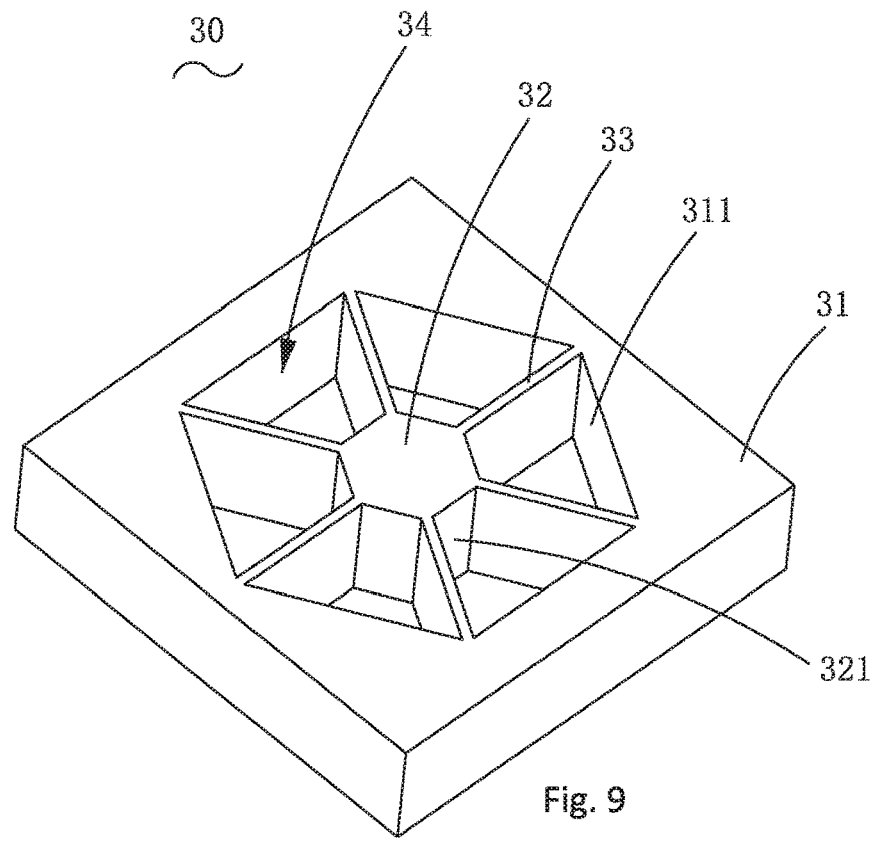
FIG. 9 is an isometric view I of a base of the piezoelectric MEMS microphone.
Figure 10:
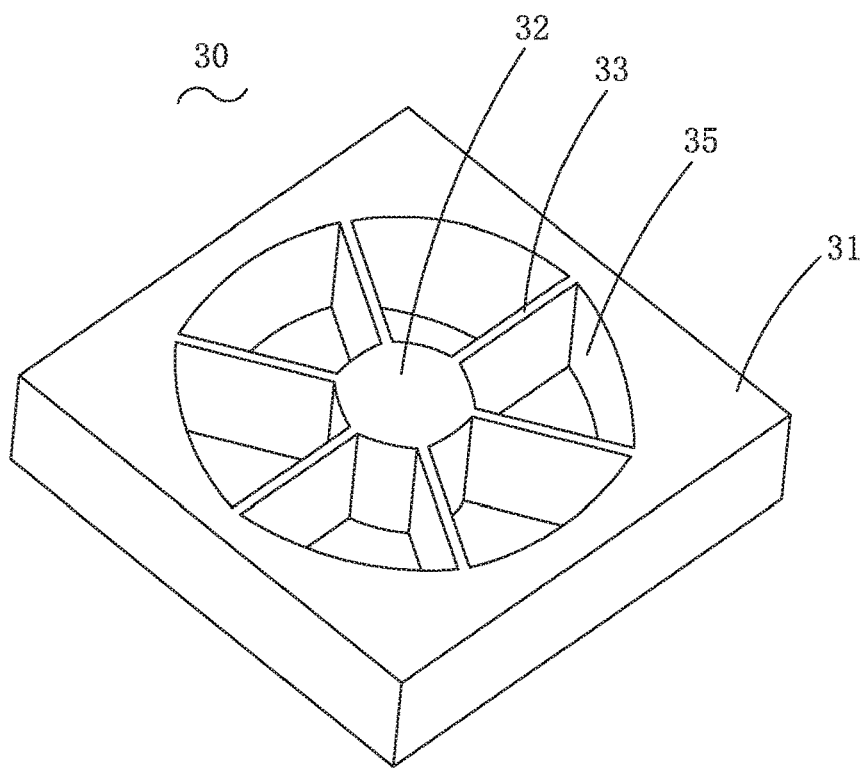
FIG. 10 is an isometric view II of a base of the piezoelectric MEMS microphone.

Further referring to FIG. 9, specifically, a second wall body 321 is arranged at one side, toward the ring base 31, of the support column 32. The projection profiles of the first wall body 311 and the second wall body 321 in the vibration direction both are polygonal; at this time, the projection profiles of the diaphragm sheets 41 in the vibration direction are trapezoidal; and the outer contour of the whole piezoelectric diaphragm 40 is of a polygonal structure.

Certainly, the shape of the base 30 is not limited to the description. Further referring to FIG. 10, the projection profiles of the first wall body 311 and the second wall body 321 in the vibration direction can also be circular, and the projection profile of single diaphragm sheet 41 in the vibration direction is fan-shaped.

Figure 11:
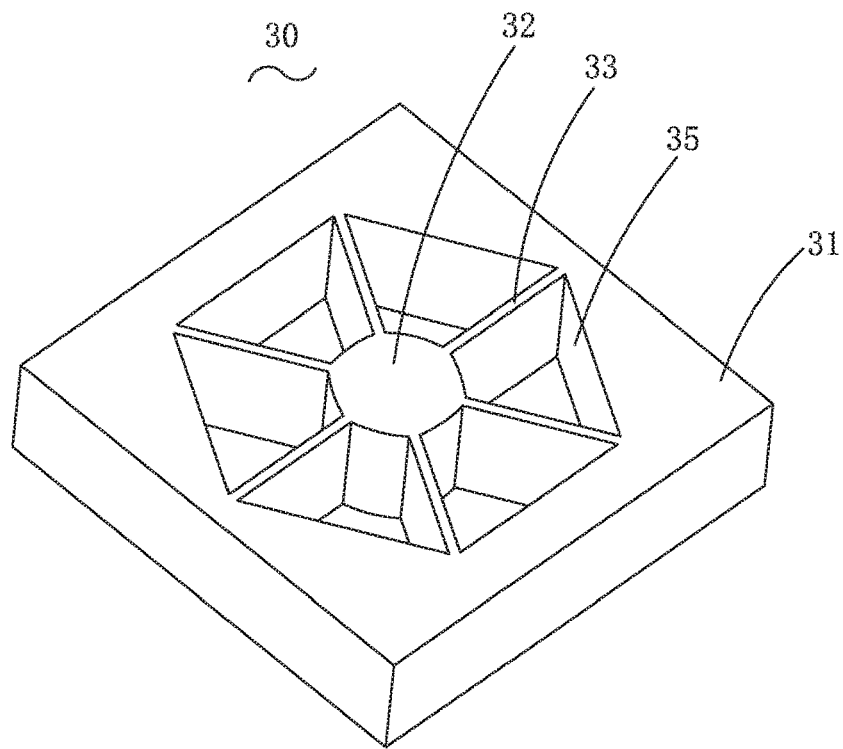
FIG. 11 is an isometric view III of a base of the piezoelectric MEMS microphone.
Figure 12:
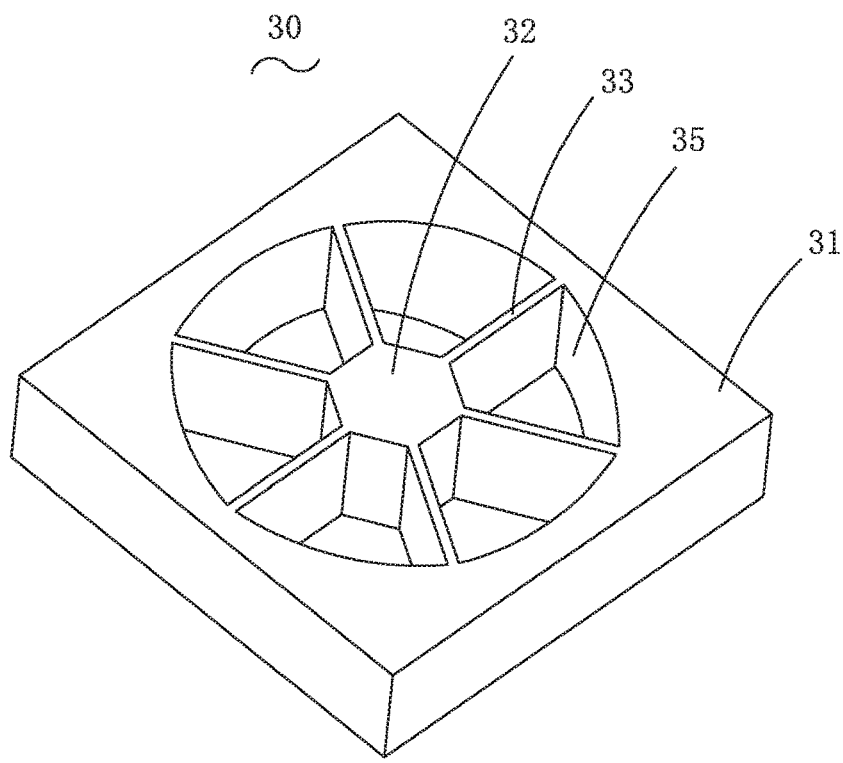
FIG. 12 is an isometric view IV of a base of the piezoelectric MEMS microphone.

Or further referring to FIGS. 11-12, one of the projection profile of the first wall body 311 in the vibration direction and the projection profile of the second wall body 321 in the vibration direction is circular and the other one is polygonal.

In the embodiment, specific structures of the fixing ends 411 and the diaphragm sheets 41 are not limited; the symmetry of the overall structure of the piezoelectric diaphragm 40 is also not limited; the diaphragm sheets 41 may be in a form of a symmetric or asymmetric polygon; the side edges of the diaphragm sheets 41 may be straight lines or curves; and all diaphragm sheets 41 of which the widths of the free ends 412 are greater than those of the fixing ends 411 of the diaphragm sheets 41 are within the scope of the invention.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A piezoelectric micro-electromechanical system (MEMS) microphone, comprising:
    a base with a cavity, comprising a ring base and a support column arranged at an inner side of the ring base and arranged apart from the ring base;
    a piezoelectric diaphragm arranged on the base, comprising a plurality of diaphragm sheets arranged spaced from each other along a circumferential direction of the support column; wherein
    each diaphragm sheet includes a fixing end connected with the support column and a free end suspended above the cavity; and the widths of the diaphragm sheets are gradually increased from the fixing ends to the free ends;
    the base further comprises a plurality of support beams arranged apart from each other; one ends of the support beams are connected with the support column and the other ends are connected with the ring base to divide the cavity into a plurality of sub-cavities along the circumferential direction of the support column; and the free ends are suspended above the sub-cavities.

2. The piezoelectric MEMS microphone as described in claim 1, wherein one free end is suspended above each sub-cavity.

3. The piezoelectric MEMS microphone as described in claim 2, wherein projection profiles of the free ends in a vibration direction are positioned within the projection profiles of the sub-cavities in the vibration direction.

4. The piezoelectric MEMS microphone as described in claim 3, wherein the projection profile of each free end in the vibration direction is the same as the projection profile of the corresponding sub-cavity in the vibration direction in shape.

5. The piezoelectric MEMS microphone as described in claim 4, including a first wall body arranged at one side of the ring base toward the support column, and a second wall body arranged at one side of the support column toward the ring base; wherein the projection profiles of the first wall body and the second wall body in the vibration direction both are circular.

6. The piezoelectric MEMS microphone as described in claim 5, wherein the projection profiles of the diaphragm sheets in the vibration direction are fan-shaped.

7. The piezoelectric MEMS microphone as described in claim 5, wherein the projection profiles of the first wall body and the second wall body in the vibration direction both are polygonal.

8. The piezoelectric MEMS microphone as described in claim 7, wherein the projection profiles of the diaphragm sheets in the vibration direction are trapezoidal.

9. The piezoelectric MEMS microphone as described in claim 5, wherein one of the projection profile of the first wall body in the vibration direction and the projection profile of the second wall body in the vibration direction is circular and the other one is polygonal.

\* \* \* \* \*